United States Patent
Kuo

(10) Patent No.: US 11,576,263 B2
(45) Date of Patent: Feb. 7, 2023

(54) CHIP ON FILM PACKAGE STRUCTURE AND METHOD FOR READING A CODE-INCLUDED PATTERN ON A PACKAGE STRUCTURE

(71) Applicant: Novatek Microelectronics Corp., Hsinchu (TW)

(72) Inventor: Te-Hsien Kuo, Keelung (TW)

(73) Assignee: Novatek Microelectronics Corp., Hsinchu (TW)

(*) Notice: Subject to any disclaimer, the term of this patent is extended or adjusted under 35 U.S.C. 154(b) by 814 days.

(21) Appl. No.: 16/512,404

(22) Filed: Jul. 16, 2019

(65) Prior Publication Data

US 2020/0214136 A1 Jul. 2, 2020

Related U.S. Application Data

(60) Provisional application No. 62/787,745, filed on Jan. 2, 2019.

(51) Int. Cl.
*H05K 1/02* (2006.01)
*H05K 1/18* (2006.01)
*H01L 23/538* (2006.01)

(52) U.S. Cl.
CPC ......... *H05K 1/187* (2013.01); *H01L 23/5387* (2013.01); *H05K 1/0266* (2013.01)

(58) Field of Classification Search
CPC ... H05K 1/0266; H05K 1/187; H01L 23/5387
See application file for complete search history.

(56) References Cited

U.S. PATENT DOCUMENTS

| 6,896,186 B2* | 5/2005 | Kudo | H01L 24/78 257/E23.179 |
| 2002/0043713 A1* | 4/2002 | Seko | H01L 23/49838 257/692 |
| 2004/0026515 A1 | 2/2004 | Rumsey | |

(Continued)

FOREIGN PATENT DOCUMENTS

CN 206388704 8/2017

OTHER PUBLICATIONS

"Office Action of China Counterpart Application", dated Apr. 30, 2021, p. 1-p. 7.

(Continued)

*Primary Examiner* — Hoa C Nguyen
(74) *Attorney, Agent, or Firm* — JCIPRNET

(57) ABSTRACT

A chip on film package structure including a flexible film, a patterned metal layer, a chip, a patterned solder resist layer, and a code-included pattern is provided. The flexible film comprises a chip mounting region and a peripheral region surrounding the chip mounting region. The patterned metal layer disposed on the flexible film. The chip mounted on the chip mounting region and electrically connected to the patterned metal layer. The patterned solder resist layer exposing the chip mounting region and covering a part of the patterned metal layer. The code-included pattern disposed on the peripheral region of the flexible film. The code-included pattern comprises a plurality of machine-readable data. A method for reading a code-included pattern on a package structure is also provided.

12 Claims, 5 Drawing Sheets

(56) References Cited

U.S. PATENT DOCUMENTS

| | | | |
|---|---|---|---|
| 2005/0236176 A1* | 10/2005 | Hsu | H05K 1/0266 174/250 |
| 2011/0071662 A1* | 3/2011 | Yokosawa | H01L 21/67294 700/121 |
| 2016/0190408 A1 | 6/2016 | Kamada | |

OTHER PUBLICATIONS

"Office Action of Taiwan Counterpart Application", dated Aug. 20, 2020, p. 1-p. 5.

\* cited by examiner

CHIP ON FILM PACKAGE STRUCTURE AND METHOD FOR READING A CODE-INCLUDED PATTERN ON A PACKAGE STRUCTURE

CROSS-REFERENCE TO RELATED APPLICATION

This application claims the priority benefits of U.S. provisional application Ser. No. 62/787,745, filed on Jan. 2, 2019. The entirety of the above-mentioned patent application is hereby incorporated by reference herein and made a part of specification.

BACKGROUND

Technical Field

The present disclosure generally relates to electronic device and a method. More particularly, the present disclosure relates to a chip on film (COF) package structure and a method for reading a code-included pattern on a package structure.

Description of Related Art

Along with the advancement of packaging technology, chip on film (COF) bonding technology has become today's one of the major packaging technologies. Misjudgment or misreading of the product information may reduce the throughput or yield of the production line or the assembly line.

SUMMARY

Accordingly, the present disclosure is directed to provide a COF package structure or a method for reading a code-included pattern on a package structure for reducing misjudgment or misreading.

The present disclosure provides a chip on film package structure including a flexible film, a patterned metal layer, a chip, a patterned solder resist layer, and a code-included pattern. The flexible film comprises a chip mounting region and a peripheral region surrounding the chip mounting region. The patterned metal layer disposed on the flexible film. The chip mounted on the chip mounting region and electrically connected to the patterned metal layer. The patterned solder resist layer exposing the chip mounting region and covering a part of the patterned metal layer. The code-included pattern disposed on the peripheral region of the flexible film. The code-included pattern comprises a plurality of machine-readable data.

According to an embodiment of the present disclosure, the machine-readable data are adapted to be extracted from an image of the code-included pattern.

According to an embodiment of the present disclosure, the code-included pattern comprises a pattern of a barcode.

According to an embodiment of the present disclosure, the plurality of machine-readable data contains product information of at least one of the chip and the chip on film package structure.

According to an embodiment of the present disclosure, the product information comprises a manufacturing date, a part number, a lot number, and/or a batch number.

According to an embodiment of the present disclosure, the patterned metal layer comprises a circuit pattern electrically connected to the chip.

According to an embodiment of the present disclosure, the code-included pattern is electrically insulated from the circuit pattern.

According to an embodiment of the present disclosure, the patterned solder resist layer covers the code-included pattern.

According to an embodiment of the present disclosure, the patterned solder resist layer covers a part of the flexible film exposed by the code-included pattern.

According to an embodiment of the present disclosure, the patterned solder resist layer is pervious to light.

According to an embodiment of the present disclosure, the patterned solder resist layer comprises a covering pattern covering the part of the patterned metal layer and the code-included pattern directly disposed on the peripheral region of the flexible film.

According to an embodiment of the present disclosure, the code-included pattern exposes a part of the flexible film.

The present disclosure provides a method for reading a code-included pattern on a package structure including the following steps: providing a package structure having a code-included pattern disposed on a peripheral region of the package structure, wherein the code-included pattern comprises a plurality of machine-readable data; capturing an image of the code-included pattern; displaying a magnified image of the code-included pattern on a display, wherein the magnified image is obtained by magnifying the image of the code-included pattern with a predetermined magnification factor; scanning the magnified image of the code-included pattern; and reading a plurality of machine-readable data extracted from the magnified image of the code-included pattern.

According to an embodiment of the present disclosure, the image of the code-included pattern is captured by a charge-coupled device (CCD).

According to an embodiment of the present disclosure, the method for reading a code-included pattern on a package structure further includes the following steps: comparing the plurality of machine-readable data with data stored in a storage device and relating to product information of the package structure.

According to an embodiment of the present disclosure, the method for reading a code-included pattern on a package structure further includes the following steps: processing the results of the comparisons in order to pair the code-included pattern with at least one of the product information of the package structure.

Accordingly, the present disclosure is directed to provide a COF package structure or a method for reading a code-included pattern on a package structure for reducing misjudgment or misreading.

In light of the foregoing, in the COF package structure, the code-included pattern disposed on a peripheral region of the package structure includes a plurality of machine-readable data. As such, misjudgment or misreading may be reduced, or the throughput or yield of the production line or the assembly line of the COF package structure may be improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
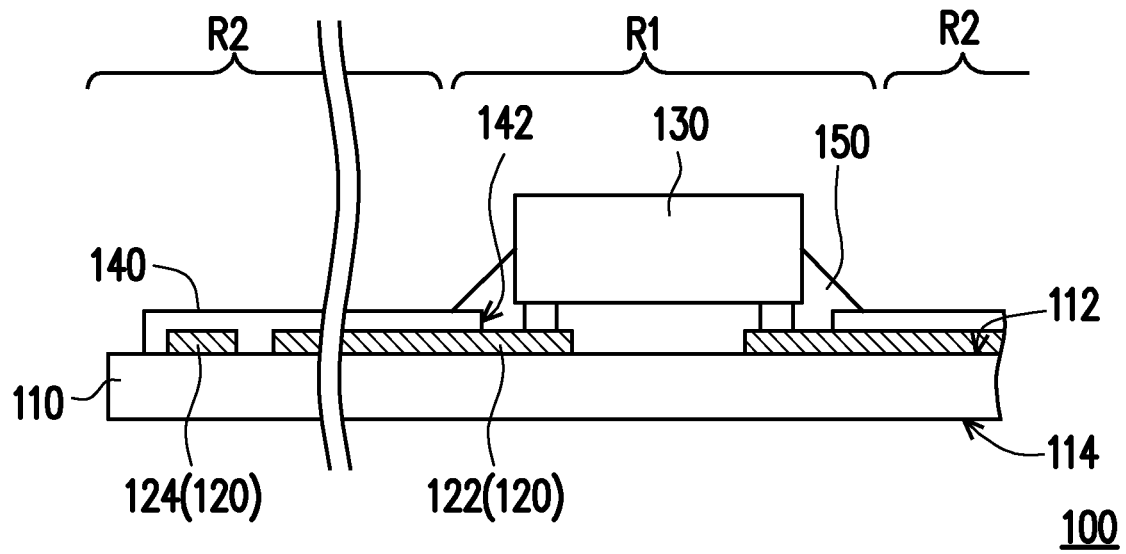
FIG. 1 illustrates a partial cross-sectional view of a chip on film package structure according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Further, in the discussion and claims herein, the term "on" used with respect to two materials, one "on" the other, means at least some contact between the materials, while "over" and "overlie" mean the materials are in proximity, but possibly with one or more additional intervening materials such that physical contact is possible but not required. Neither "on" nor "over" implies any directionality as used herein.

Unless limited otherwise, the terms "disposed", "connected", "coupled", "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Accordingly, the drawings and descriptions will be regarded as illustrative in nature and not as restrictive.

Figure 2:
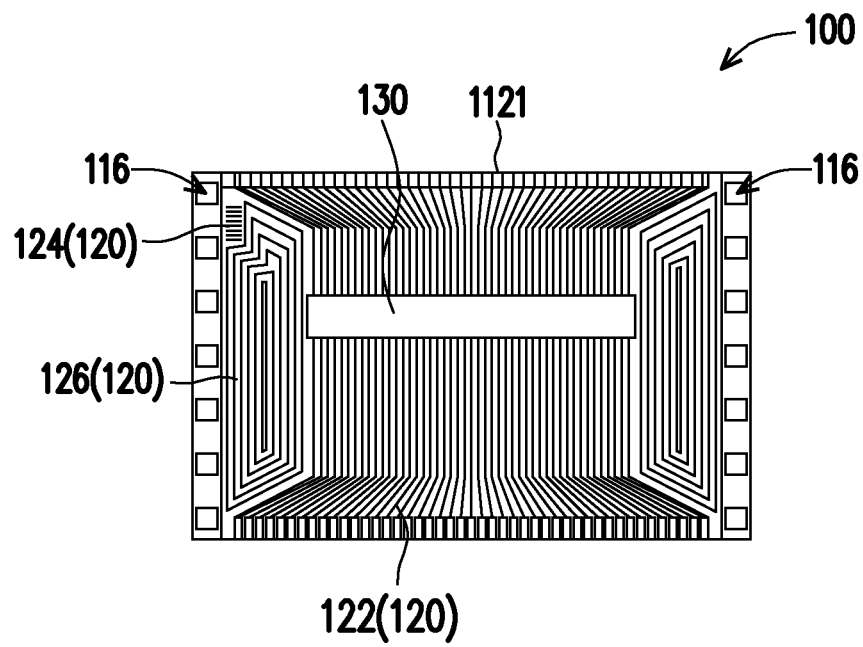
FIG. 2 illustrates a perspective top view of a chip on film package structure according to a first embodiment of the disclosure.
Figure 3:
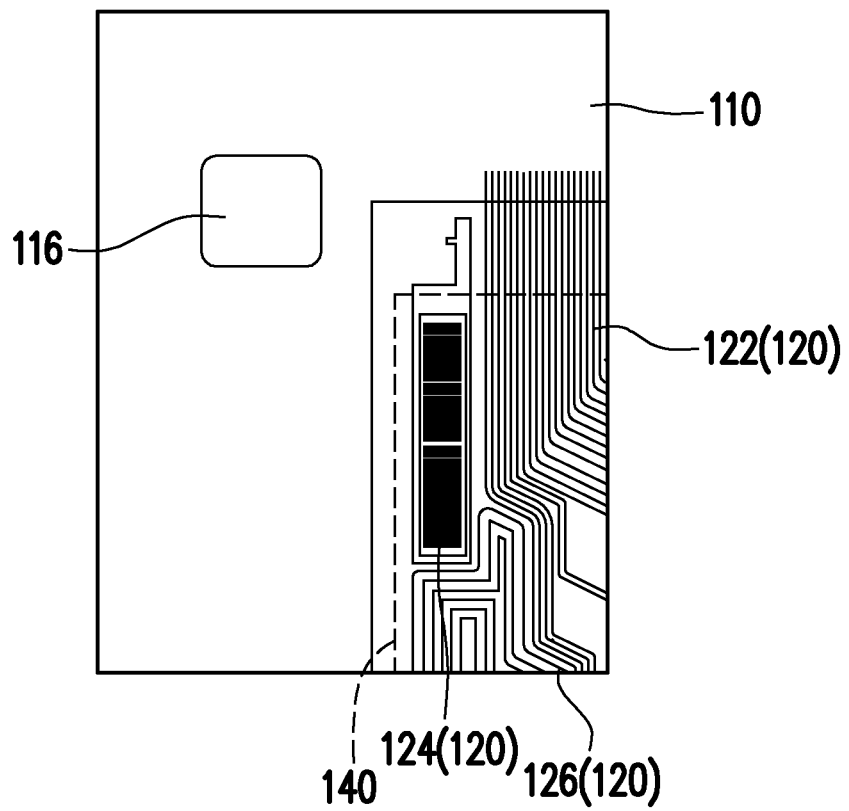
FIG. 3 illustrates a partial perspective top view of a chip on film package structure according to a first embodiment of the disclosure.
Figure 4:
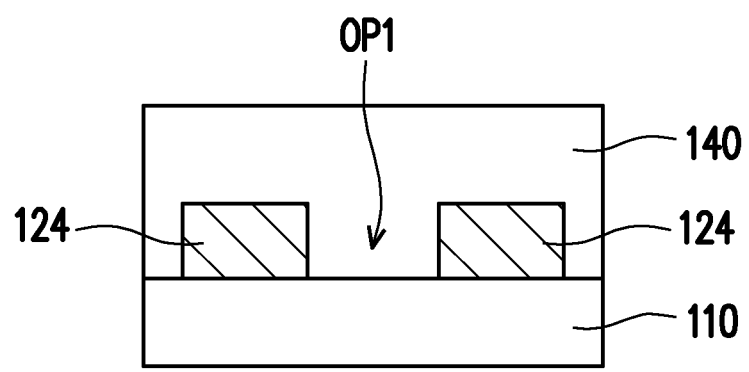
FIG. 4 illustrates a perspective top view of a chip on film package structure according to a first embodiment of the disclosure.

FIG. 1 illustrates a partial cross-sectional view of a chip on film package structure according to a first embodiment of the disclosure. FIG. 2 illustrates a perspective top view of a chip on film package structure according to a first embodiment of the disclosure. FIG. 3 illustrates a partial perspective top view of a chip on film package structure according to a first embodiment of the disclosure. FIG. 4 illustrates a perspective top view of a chip on film package structure according to a first embodiment of the disclosure.

Referring to FIGS. 1 to 4, a chip on film (COF) package structure 100 includes a flexible film 110, a patterned metal layer 120, a chip 130, a patterned solder resist layer 140, and a code-included pattern 124. The flexible film 110 includes a chip mounting region R1 and a peripheral region R2 surrounding the chip mounting region R1. The flexible film 110 has a first surface 112 and a second surface 114 opposite to the first surface 112. The patterned metal layer 120 can be disposed on the first surface 112 of the flexible film 110. The chip 130 is mounted on the chip mounting region R1 and electrically connected to a corresponding part of the patterned metal layer 120. The patterned solder resist layer 140 exposes the chip mounting region R1 and covers a part of the patterned metal layer 120. The code-included pattern 124 can be disposed on the peripheral region R2 of the flexible film 110 or any region according to design requirements. The code-included pattern 124 includes or represents a plurality of machine-readable data. In other words, the machine-readable data or information associated with the COF package structure 100 can be obtained or extracted by decoding the code-included pattern 124.

In an embodiment, the flexible film 110 may have a plurality of transport holes 116 adapted to transport the flexible film 110 during the production process of the COF package structure 100.

In an embodiment, the patterned metal layer 120 may include a circuit pattern 122 electrically connected to the chip 130 and the code-included pattern 124. In other words, the code-included pattern 124 may be a part of the patterned metal layer 120, but the disclosure is not limited thereto. In another embodiment, a code-included pattern may be not a part of the patterned metal layer 120.

In an embodiment, the chip 130 is may be electrically connected to the circuit pattern 122 by inner lead bonding (ILB), but the disclosure is not limited thereto.

In an embodiment, an underfill 150 may be formed between the chip 130 and the flexible film 110. The adhesion between the chip 130 and the flexible film 110 may be improved.

In an embodiment, the code-included pattern 124 may be electrically insulated from the circuit pattern 122, but the disclosure is not limited thereto.

In an embodiment, the patterned metal layer 120 may further include a dummy pattern 126 insulated from the circuit pattern 122, but the disclosure is not limited thereto.

In an embodiment, the circuit pattern 122, the code-included pattern 124, and the dummy pattern 126 may be the same film layer, but the disclosure is not limited thereto.

In an embodiment, the machine-readable data may be adapted to be extracted from an image of the code-included pattern 124. As shown in FIG. 3, the code-included pattern 124 may be a pattern of a barcode. The barcode may be a one-dimensional (1D) barcode or a two-dimensional (2D) barcode, but the disclosure is not limited thereto. The 1D barcode can be any kind of 1D barcode such as ITF code, EAN-13 code, EAN-8 code, Codabar code, UPC code, Code 93 code, Code 11 code, MSI code, Plessey code, Toshiba code, Code 32 code, or RSS code. The 2D barcode can be any kind of 2D barcode such as QR code, PDF417 2D code, a combination code of 1D Barcode and PDF417code, S1 Data Matrix, or GS1 QR code. The barcode can be captured by an image sensor, a camera or any image capturing device and the captured image can then be decoded by a processor to provide more information. By decoding the barcode, different applications can be realized to meet various requirements, such as text transmission/representation, downloading of digital contents, quick linking to webpages, and identification associated with the product (i.e., the COF package structure 100). In other words, the code-included pattern can be read faster and include more information or data than simple symbols such as texts or numbers. Accordingly, with the code-included pattern, various applications such as product tracking, identification or recognition, management, inventory and/or sale can be more easily manipulated.

In an embodiment, the patterned solder resist layer 140 may cover the code-included pattern 124, but the disclosure is not limited thereto.

In an embodiment, the patterned solder resist layer 140 may cover a part of the flexible film 110 exposed by an opening OP1 of the code-included pattern 124, but the disclosure is not limited thereto.

In an embodiment, there may be no metal layer (e.g. a metal layer similar to the patterned metal layer 120) and/or solder resist layer (e.g. a solder resist layer similar to the patterned solder resist layer 140) disposed on the second surface 114 of the flexible film 110, but the disclosure is not limited thereto.

In an embodiment, the code-included pattern 124 may be disposed between the transport holes 116 of the flexible film 110 and the chip 130 in a top view (e.g., as shown in FIG. 2). In other words, on the same side of the chip 130, the transport holes 116 may be closer to the edge of the flexible film 110 than the code-included pattern 124. That is, there may be no transport hole (e.g., transport hole similar to the transport hole 116) between the code-included pattern 124 and the chip 130.

In an embodiment, the plurality of machine-readable data may contain product information of at least one of the chip 130 and the COF package structure 100.

In an embodiment, the product information may comprise a manufacturing date, a part number, a lot number, a batch number, or the combination of the foregoing information, but the disclosure is not limited thereto. In other words, the product information may be encoded in an image of the code-included pattern 124.

For example, as shown in FIGS. 3 and 4, the patterned solder resist layer 140 may be pervious to light. In other word, the patterned solder resist layer 140 may be a light-transmissive patterned solder resist layer. The code-included pattern 124 and a corresponding region exposed by the opening OP1 of the code-included pattern 124 may have different light reflectivity. As such, an image of the code-included pattern 124 may be captured by an image capturing device (e.g., an image capturing device 200 shown in FIG. 200), and then the product information of the chip 130 and the COF package structure 100 may be decoded by an processor (e.g., an processor 500 shown in FIG. 200).

Figure 5:
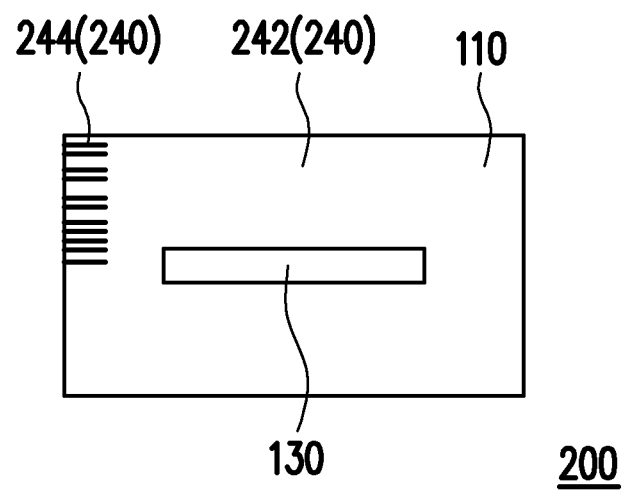
FIG. 5 illustrates a partial perspective top view of a chip on film package structure according to a second embodiment of the disclosure.
Figure 6:
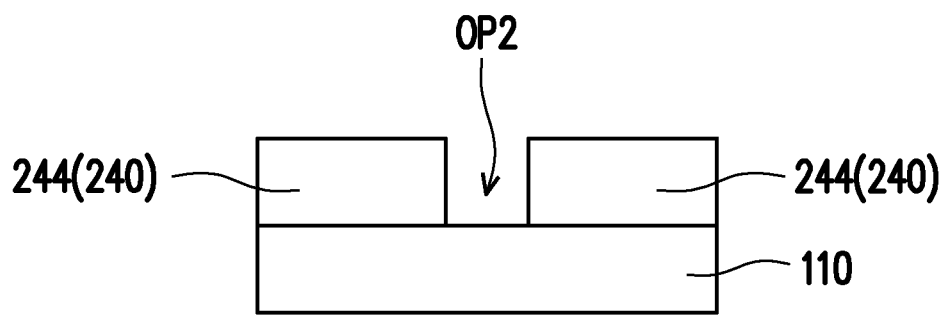
FIG. 6 illustrates a perspective top view of a chip on film package structure according to a second embodiment of the disclosure.

FIG. 5 illustrates a partial perspective top view of a chip on film package structure according to a second embodiment of the disclosure. FIG. 6 illustrates a perspective top view of a chip on film package structure according to a second embodiment of the disclosure. The chip on film (COF) package structure 200 of the embodiment is similar to the COF package structure 100 of the first embodiment, and similar components are marked by identical or similar reference numerals and have similar function, material, or may be formed in a similar manner, and thus relevant descriptions are omitted hereinafter. In addition, a part of the film layer or element is omitted in FIGS. 5 to 6 for clarity. For example, the patterned metal layer (not shown) is omitted in FIGS. 5 to 6, and the configuration, function, material or formation manner thereof may be the same or similar to the patterned metal layer 120 in the first embodiment.

Referring to FIGS. 5 to 6, a COF package structure 200 includes a flexible film 110, a patterned metal layer (as a part of the patterned metal layer 120 shown in FIG. 1), a chip 130, a patterned solder resist layer 240, and a code-included pattern 244. The code-included pattern 244 disposed on the peripheral region R2 (as shown in FIG. 1) of the flexible film 110. The patterned solder resist layer 240 exposes the chip mounting region R1 and covers a part of the patterned metal layer 120. The code-included pattern 244 includes a plurality of machine-readable data.

In an embodiment, the patterned solder resist layer 240 may include a covering pattern 242 disposed on the peripheral region R2 of the flexible film 110. The code-included pattern 244 may be a part of the covering pattern 242. In other words, at least part of the patterned solder resist layer 240 disposed on the peripheral region R2 of the flexible film 110 may be adapted as the code-included pattern 244.

For example, at least part of the patterned solder resist layer 240 may be directly disposed on the peripheral region R2 of the flexible film. A plurality of openings OP2 of the patterned solder resist layer 240 may expose a part of the peripheral region R2 of the flexible film 110. The openings OP2 may be form by laser marking technology, but the disclosure is not limited thereto. The patterned solder resist layer 240 and a corresponding region exposed by the opening OP2 may have different light reflectivity. As such, a pattern formed by a part of the patterned solder resist layer 240 between the openings OP2 and the openings OP2 may be adapted as the code-included pattern 244.

Figure 7:
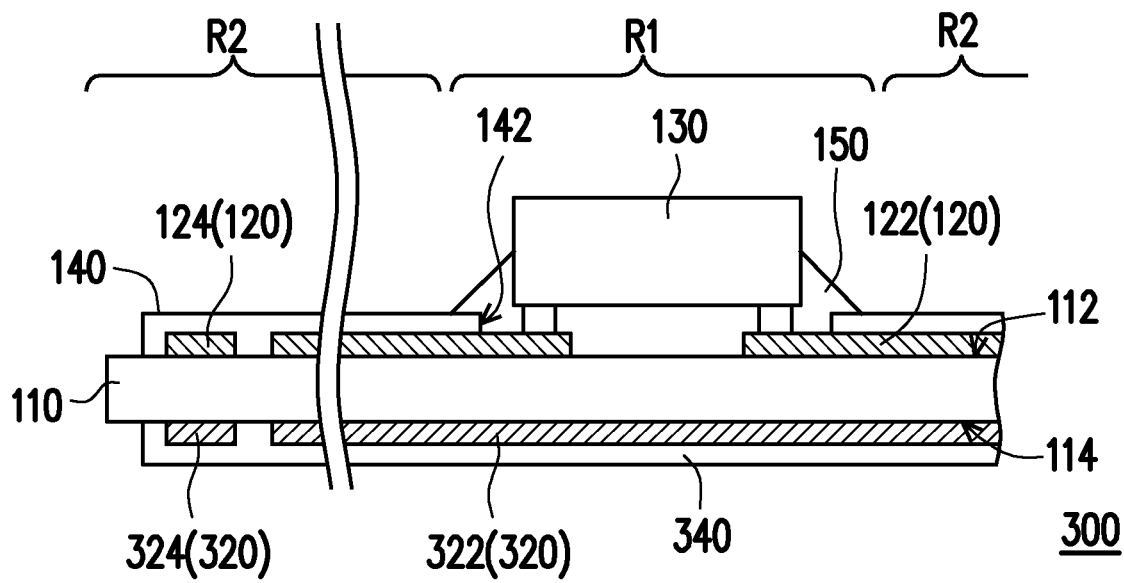
FIG. 7 illustrates a partial cross-sectional view of a chip on film package structure according to a third embodiment of the disclosure.
Figure 8:
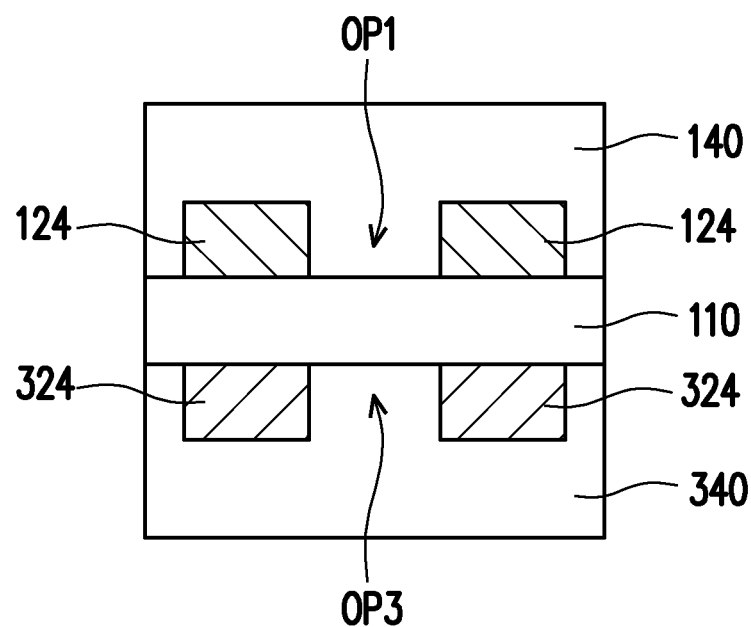
FIG. 8 illustrates a perspective top view of a chip on film package structure according to a third embodiment of the disclosure.

FIG. 7 illustrates a partial cross-sectional view of a chip on film package structure according to a third embodiment of the disclosure. FIG. 8 illustrates a perspective top view of a chip on film package structure according to a third embodiment of the disclosure. The chip on film (COF) package structure 300 of the embodiment is similar to the COF package structure 100 of the first embodiment, and similar components are marked by identical or similar reference numerals and have similar function, material, or may be formed in a similar manner, and thus relevant descriptions are omitted hereinafter.

Referring to FIGS. 5 to 6, a COF package structure 300 may further include a patterned metal layer 320 and a patterned solder resist layer 340. The patterned metal layer 320 may be disposed on the second surface 114 of the flexible film 110. The patterned solder resist layer 340 may cover a part of the patterned metal layer 320.

In an embodiment, a part of the patterned metal layer 120 may be electrically connected to a corresponding part of the patterned metal layer 320 via a through hole (e.g., a plating through hole (PTH); not shown), but the disclosure is not limited thereto.

In an embodiment, the patterned metal layer 320 may include a circuit pattern 122 and a code-included pattern 324. In other words, the code-included pattern 324 may be a part of the patterned metal layer 320, but the disclosure is not limited thereto. The code-included pattern 324 may be disposed on the peripheral region R2 of the flexible film 110. The code-included pattern 324 may include or represent a plurality of machine-readable data.

In an embodiment, the machine-readable data may be adapted to be extracted from an image of the code-included pattern 324.

Similar to the code-included pattern 124 as shown in FIG. 3, the code-included pattern 324 may be a pattern of a barcode.

In an embodiment, the patterned solder resist layer 340 may cover the code-included pattern 324, but the disclosure is not limited thereto.

In an embodiment, the patterned solder resist layer 340 may cover a part of the flexible film 110 exposed by an opening OP3 of the code-included pattern 324, but the disclosure is not limited thereto.

In an embodiment, the opening OP3 of the code-included pattern 324 may be corresponding to the opening OP1 of the code-included pattern 124. In other words, the code-included pattern 124 and the code-included pattern 324 on opposite surfaces of the flexible film 110 may be mirror symmetrical, but the disclosure is not limited thereto.

Figure 9:
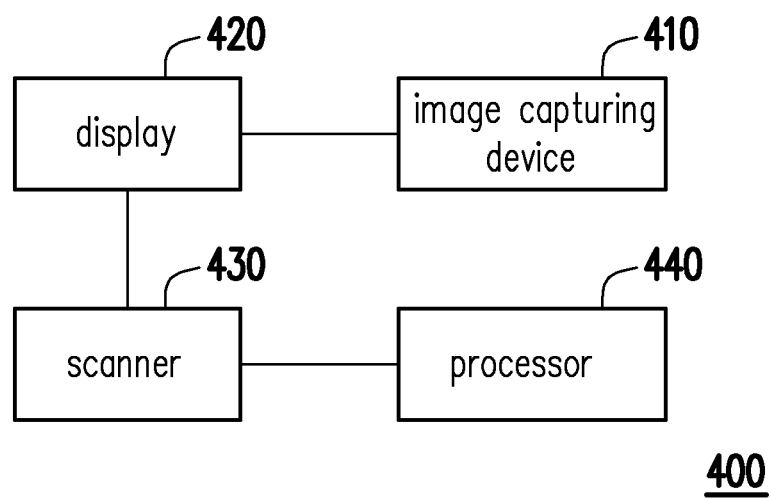
FIG. 9 illustrates a system for reading a code-included pattern on a package structure according to an embodiment of the disclosure.

FIG. 9 illustrates a system for reading a code-included pattern on a package structure according to an embodiment of the disclosure.

In an embodiment, a system 400 for reading a code-included pattern on a package structure (e.g., the code-included pattern 124 on the COF package structure 100 or the code-included pattern 244 on the COF package structure 200) may be a combination of one or more instruments, one or more apparatus, and/or one or more equipment, but the disclosure is not limited thereto. For example, the system 400 may include an image capturing device 410, a display 420, a scanner 430, and a processor 440. In the following description, the code-included pattern to be read is exemplified by the code-included pattern 124 on the COF package structure 100, but the disclosure is not limited thereto.

A method for reading the code-included pattern 124 includes the following steps: providing the package structure 100 having the code-included pattern 124; capturing an image of the code-included pattern 124; displaying a magnified image of the code-included pattern 124 on the display 420, wherein the magnified image is obtained by magnifying the image of the code-included pattern 124 with a predetermined magnification factor; scanning the magnified image of the code-included pattern 124; and reading a plurality of machine-readable data extracted from the magnified image of the code-included pattern 124.

In an embodiment, the image of the code-included pattern 124 may be captured by the image capturing device 410.

In an embodiment, the image capturing device 410 may include a charge-coupled device (CCD). In other words, the image of the code-included pattern 124 may be captured by a charge-coupled device.

In an embodiment, the magnified image of the code-included pattern 124 may be scanned by the scanner 430.

In an embodiment, the machine-readable data extracted from the magnified image of the code-included pattern 124 may be read by the processor 440. For example, the processor 440 may include a computer. In other words, the machine readable data may be extracted (or be decoded) from the magnified image of the code-included pattern 124, and then the machine readable data may be read or processed by the processor 440.

In an embodiment, the method for reading the code-included pattern 124 may further include the following steps: comparing the plurality of machine-readable data with data stored in a storage device and relating to product information of the package structure 100. For example, the processor 440 may include a storage device (e.g., a computer with a hard disk). The data related to product information of the package structure 100 may be stored in the storage device. The machine readable data and the data related to product information of the package structure 100 may be compared by the processor 440.

In an embodiment, the method for reading the code-included pattern 124 may further include the following steps: processing the results of the comparisons in order to pair the code-included pattern 124 with at least one of the product information of the package structure 100. For example, after the machine readable data and the data related to product information of the package structure 100 is compared, the results of the comparisons (e.g., the results of the step of comparing the plurality of machine-readable data with the data related to product information of the package structure) may be processed by the processor 440 in order to pair the code-included pattern 124 with at least one of the product information of the package structure 100.

Based on the above discussions, it can be seen that the present disclosure offers various advantages. It is understood, however, that not all advantages are necessarily discussed herein, and other embodiments may offer different advantages, and that no particular advantage is required for all embodiments.

In sum, in the COF package structure, the code-included pattern disposed on a peripheral region of the package structure includes a plurality of machine-readable data. As such, misjudgment or misreading may be reduced, or the throughput or yield of the production line or the assembly line of the COF package structure may be improved. In addition, the code-included pattern can be read faster and include more information or data. Furthermore, with the code-included pattern, various applications such as product tracking, identification or recognition, management, inventory and/or sale can be more easily manipulated.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package structure, comprising:
a flexible film comprising a chip mounting region and a peripheral region surrounding the chip mounting region;
a patterned metal layer disposed on the flexible film;
a chip mounted on the chip mounting region and electrically connected to the patterned metal layer;
a patterned solder resist layer exposing the chip mounting region and covering a part of the patterned metal layer; and
a code-included pattern disposed on the peripheral region of the flexible film, wherein the code-included pattern comprises a plurality of machine-readable data, wherein the code-included pattern is in direct contact with the peripheral region of the flexible film, and the code-included pattern exposes a part of the flexible film.

2. The chip on film package structure as claimed in claim 1, wherein the code-included pattern comprises a pattern of a barcode.

3. The chip on film package structure as claimed in claim 1, wherein the machine-readable data are adapted to be extracted from an image of the code-included pattern.

4. The chip on film package structure as claimed in claim 3, wherein the plurality of machine-readable data contains product information of at least one of the chip and the chip on film package structure.

5. The chip on film package structure as claimed in claim 4, wherein the product information comprises a manufacturing date, a part number, a lot number, and/or a batch number.

6. The chip on film package structure as claimed in claim 1, wherein the patterned metal layer comprises a circuit pattern electrically connected to the chip.

7. The chip on film package structure as claimed in claim 6, wherein the code-included pattern is electrically insulated from the circuit pattern.

8. The chip on film package structure as claimed in claim 1, wherein the patterned solder resist layer covers the code-included pattern.

9. The chip on film package structure as claimed in claim 1, wherein the patterned solder resist layer covers a part of the flexible film exposed by the code-included pattern.

10. The chip on film package structure as claimed in claim 1, wherein the patterned solder resist layer is pervious to light.

11. The chip on film package structure as claimed in claim 1, wherein the patterned solder resist layer comprises a covering pattern directly disposed on the peripheral region of the flexible film.

12. A chip on film package structure, comprising:
a flexible film comprising a chip mounting region and a peripheral region surrounding the chip mounting region;
a patterned metal layer disposed on the flexible film;
a chip mounted on the chip mounting region and electrically connected to the patterned metal layer;
a patterned solder resist layer exposing the chip mounting region and covering a part of the patterned metal layer; and
a code-included pattern disposed on the peripheral region of the flexible film, wherein the code-included pattern comprises a plurality of machine-readable data, wherein the patterned solder resist layer comprises a covering pattern directly disposed on the peripheral region of the flexible film, and the code-included pattern is a portion of the covering pattern.

* * * * *